(12) United States Patent
Furutani et al.

(10) Patent No.: US 10,237,917 B2
(45) Date of Patent: Mar. 19, 2019

(54) HEATER AND APPARATUS FOR MANUFACTURING SEMICONDUCTOR DEVICE USING HEATER

(71) Applicant: NuFlare Technology, Inc., Yokohama-shi (JP)

(72) Inventors: Hiroshi Furutani, Kanagawa-ken (JP); Yuusuke Sato, Tokyo (JP); Kunihiko Suzuki, Shizuoka-Ken (JP)

(73) Assignee: NuFlare Technology, Inc., Yokohama-shi (JP)

( * ) Notice: Subject to any disclaimer, the term of this patent is extended or adjusted under 35 U.S.C. 154(b) by 99 days.

(21) Appl. No.: 15/064,105

(22) Filed: Mar. 8, 2016

(65) Prior Publication Data

US 2016/0270150 A1    Sep. 15, 2016

(30) Foreign Application Priority Data

Mar. 9, 2015 (JP) .............................. 2015-045838
Jan. 29, 2016 (JP) .............................. 2016-016125

(51) Int. Cl.
*H05B 3/26* (2006.01)
*H05B 1/02* (2006.01)
*H01L 21/67* (2006.01)

(52) U.S. Cl.
CPC ..... *H05B 1/0233* (2013.01); *H01L 21/67103* (2013.01); *H05B 3/26* (2013.01)

(58) Field of Classification Search
CPC .... H05B 1/0233; H05B 3/26; H01L 21/67103
(Continued)

(56) References Cited

U.S. PATENT DOCUMENTS 4,481,406 A * 11/1984 Muka ...................... C30B 1/02
                                                      219/390
5,671,323 A *  9/1997 Honda .................... C23C 16/46
                                                      219/444.1
(Continued)

FOREIGN PATENT DOCUMENTS

JP        10-208855 A     8/1998
JP        11-317264 A    11/1999
(Continued)

OTHER PUBLICATIONS

Machine translation of Sotodani JPO H10-208855.*
(Continued)

*Primary Examiner* — Joseph M Pelham
(74) *Attorney, Agent, or Firm* — Oblon, McClelland, Maier & Neustadt, L.L.P.

(57) ABSTRACT

A heater according to an embodiment of the present disclosure includes a heater element including a flat heat generating body, a linear slit formed in a linearly opened manner with one end arranged at an outer circumference of the heat generating body and the other end arranged in the turnover portion of the heat generating body, and a turnover portion formed in an opened manner to continue from the other end, an opening diameter of the turnover portion being larger than a slit width of the linear slit, the heater element generating heat by electrification, and a pair of electrodes connected to a predetermined face of the heater element, a voltage being applied on the electrodes during electrification of the heater element.

3 Claims, 9 Drawing Sheets (58) Field of Classification Search
USPC ......................................................... 219/409
See application file for complete search history.

(56) References Cited

U.S. PATENT DOCUMENTS

| | | | | |
|---|---|---|---|---|
| 5,700,992 | A | * | 12/1997 | Honda .................... C23C 16/46 219/444.1 |
| 6,512,207 | B1 | * | 1/2003 | Dress ................ H01L 21/67103 118/724 |
| 7,812,289 | B2 | * | 10/2010 | Torigoe .................. H05B 3/143 219/444.1 |
| 8,263,914 | B2 | * | 9/2012 | Clark ....................... H05B 3/64 219/409 |
| 2004/0035846 | A1 | * | 2/2004 | Hiramatsu ........ H01L 21/67103 219/444.1 |
| 2010/0039747 | A1 | * | 2/2010 | Sansoni ............. H01L 21/6833 361/234 |
| 2015/0053667 | A1 | | 2/2015 | Kushihashi et al. |

FOREIGN PATENT DOCUMENTS

| | | |
|---|---|---|
| JP | 2002-246155 A | 8/2002 |
| KR | 10-2015-0021885 A | 3/2015 |

OTHER PUBLICATIONS

Machine translation of Kariya JPO 2002-246155.*
Office Action dated Feb. 16, 2017 in Korean Patent Application No. 10-2016-0026097 (with English translation).
Office Action dated Aug. 29, 2017 in Korean Patent Application No. 10-2016-0026097 (with English language translation).
Combined Office Action and Search Report dated Apr. 19, 2018 in Chinese Patent Application No. 201610130482.1 with English translation.

* cited by examiner

HEATER AND APPARATUS FOR MANUFACTURING SEMICONDUCTOR DEVICE USING HEATER

CROSS-REFERENCE TO RELATED APPLICATIONS

This application is based upon and claims the benefit of priority from Japan Patent Application No. 2015-045838, filed on Mar. 9, 2015, and Japan Patent Application No. 2016-016125, filed on Jan. 29, 2016, the entire contents of which are incorporated herein by reference.

FIELD

Embodiments described herein relate generally to a heater and an apparatus for manufacturing a semiconductor device using the heater.

BACKGROUND

In recent years, as further reduction in price and higher performance have been required of semiconductor devices, higher productivity in a film forming process of a wafer and higher quality, such as improved evenness in film thickness, have also been required.

To meet such requirements, backside heating is employed using a single epitaxial film forming apparatus in which, for example, a wafer rotating at a high speed of 900 rpm or above in a reaction chamber is heated from the backside using a heater configured with a resistive heat generating body while a process gas is supplied into the reaction chamber.

In such epitaxial film forming apparatus, reduction in the heat capacity of a heater is required to improve thermal responsiveness. One idea to reduce the heat capacity of the heater is to make the heater thinner, but a turnover portion should be widen to adjust the electrical resistance to a desired value.

However, a current does not flow evenly in the heater element but concentrates at the turnover portion. The current concentration causes breakage at the turnover portion, which disadvantageously shortens the life of a heater.

DETAILED DESCRIPTION

The embodiment of the present disclosure will be described below with reference to the drawings.

First Embodiment

Figure 1:
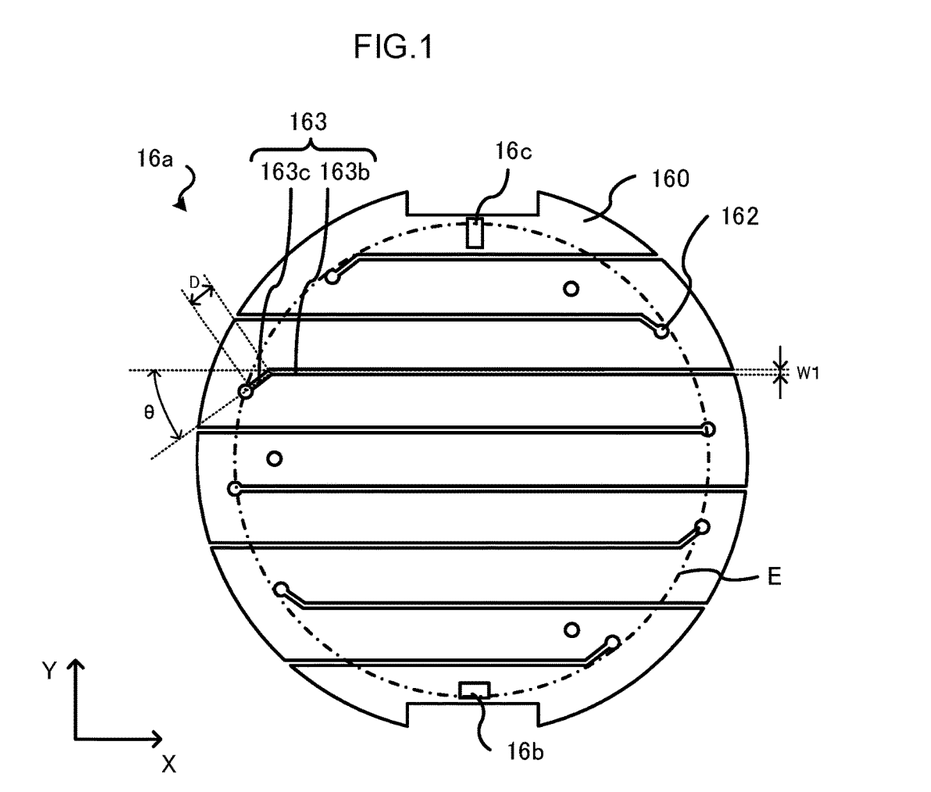
FIG. 1 is a top view of a heater element constituting a resistive heater according to a first embodiment.

FIG. 1 is a top view of a heater element 16a constituting a resistive heater which is a heater according to the embodiment. As illustrated in FIG. 1, the heater element 16a has a disk-shaped heat generating body 160 and a linearly opened linear slit 163. An end of the linear slit 163 is at the outer circumference of the heat generating body 160 and the other end is in the heat generating body 160. A turnover portion 162 is formed in an opened manner to continue from the other end with the opening diameter of the turnover portion 162 being larger than the slit width of the linear slit 163.

In the embodiment, except two linear slits 163 of which distances in the Y axis direction in FIG. 1 from the center of the heat generating body 160 are the shortest, each of the rest of the six linear slits 163 has an end portion 163c extending from the end of the linear slit 163 by a predetermined distance D (for example, 5 to 10 mm) inclines toward the direction along a concentric circle E which is concentric with the outer rim of the heater element 16a, against the center line of a main portion 163b, which is the portion of the linear slit 163 extending in the X-axis direction in FIG. 1.

Figure 2:
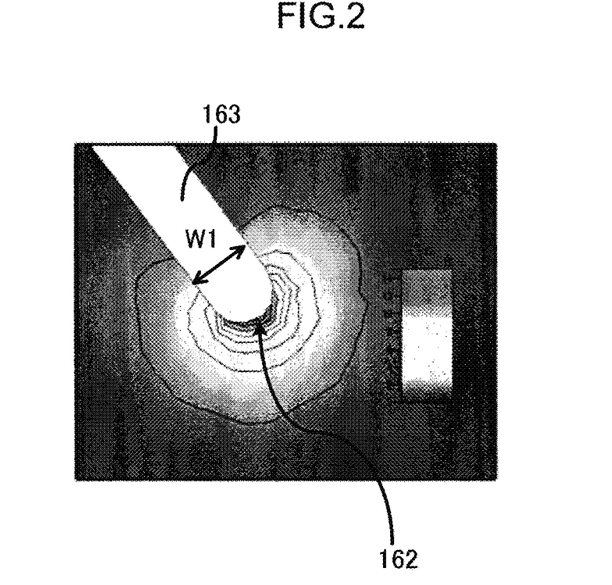
FIG. 2 is a figure explaining a heat generation distribution at and near a turnover portion of a conventional heater element.

Each turnover portion 162 in the heat generating body 160 continues from the end portion 163c and is arranged on the concentric circle E to be shifted from the center line of the linear slit 163 except of the end portion 163c by a predetermined angle of θ. The heat generating body 160 has a point symmetric shape as a whole. FIG. 2 is a figure explaining the heat generation distribution at and near the turnover portion 162 of a conventional heater element 16a. The figure illustrates a current concentrating at the turnover portion 162 to generate heat to cause high temperature. The peripheral region of the distal end portion also has high temperature gradient and high heat generation.

Figure 3:
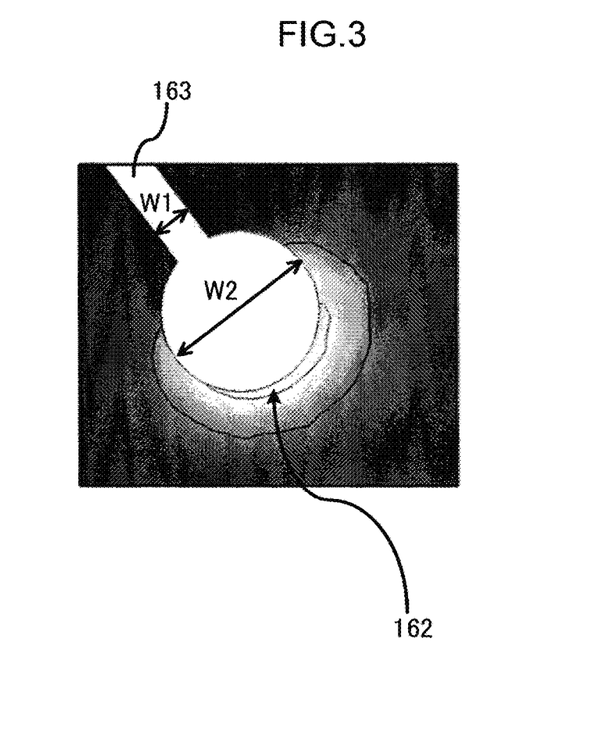
FIG. 3 is a figure explaining a heat generation distribution at and near a turnover portion of the heater element illustrated in FIG. 1.

In contrast, FIG. 3 is a figure explaining the heat generation distribution at and near the turnover portion 162 of the heater element 16a according to the embodiment. Different from the case in FIG. 2, the turnover portion 162 has an opening diameter W2 larger than the slit width W1 of the slit 163. For this reason, a current does not concentrate at a point in the distal end portion in the periphery of the turnover portion 162 and thus the temperature gradient is moderate.

Such heater element 16a is integrated with a heater electrode portions 16b and 16c supporting the heater element 16a by adhesion or fusion bonding to constitute a heater. For example, an SiC sintered compact obtained by sintering SiC powder is used for the heater element 16a and the heater electrode portions 16b and 16c. The electrical resistivity can be adjusted by controlling the concentration of impurities added to the SiC powder. The heater element 16a can be machined into a desired form and thickness. For example, the heater element 16a can be formed to have a diameter of φ250 mm and a thickness of 2 mm. The linear slit 163 and the turnover portion 162 can be formed by processing an SiC sintered substrate by wire electric discharge machining. An SiC film having high purity is formed on the surface of the heater element to prevent diffusion of impurities.

Such heater is used as a heater for heating a semiconductor substrate (wafer) from the backside in a semiconductor manufacturing apparatus.

Figure 4:
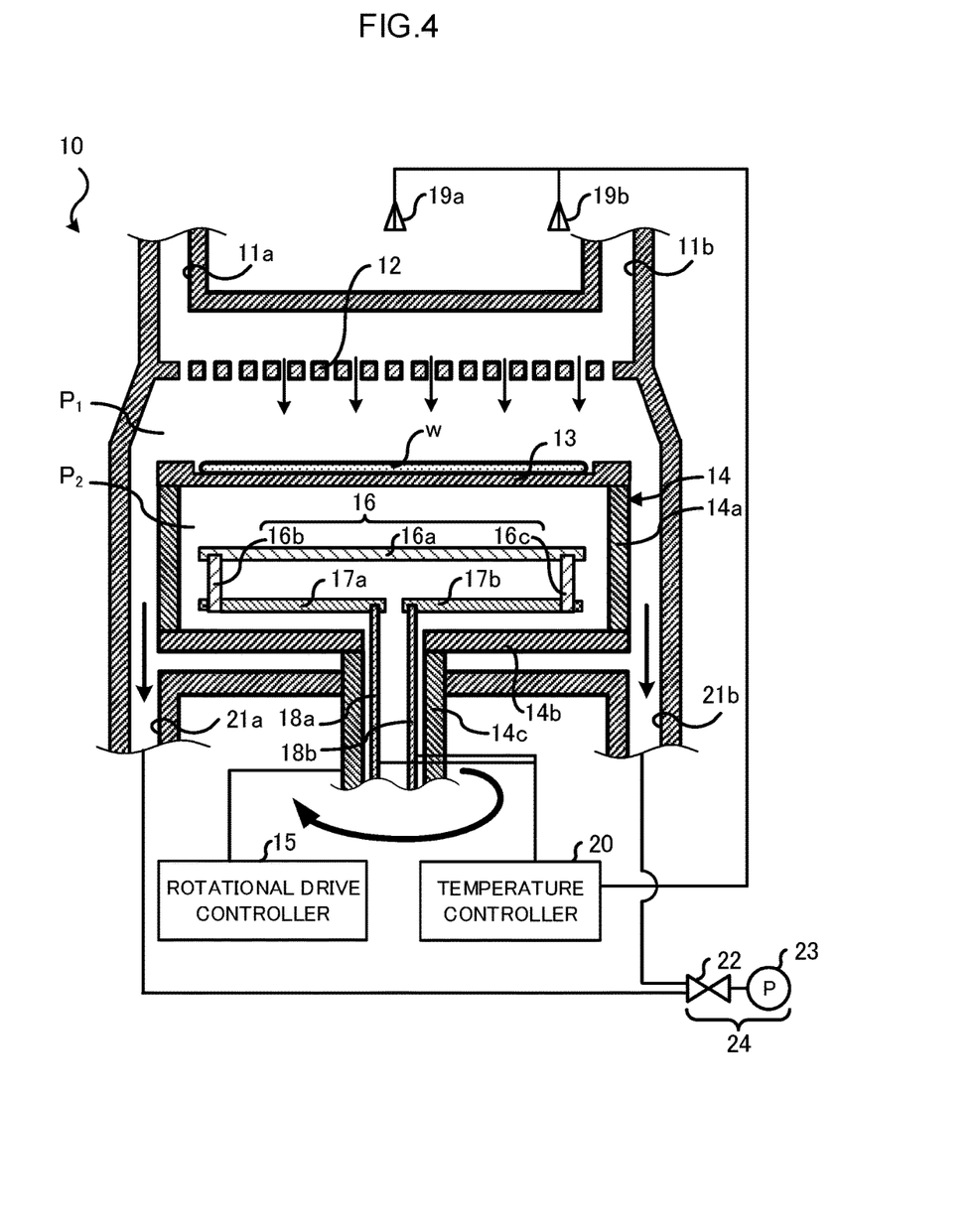
FIG. 4 is a figure illustrating a schematic configuration of a semiconductor manufacturing apparatus using the resistive heater according to the first embodiment.

FIG. 4 is a figure illustrating a schematic configuration of a semiconductor manufacturing apparatus using the resistive heater according to the embodiment. As illustrated in FIG. 4, the semiconductor manufacturing apparatus includes a reaction chamber 10 for performing film forming processing. Gas supply inlets 11a and 11b are provided in the upper portion of the reaction chamber 10. A process gas including a source gas (for example, ammonia gas ($NH_3$ gas), trimethylaluminum gas (TMA gas), trimethylgallium gas (TMG gas), triethylgallium gas (TEG gas), triethylindium gas (TEI gas), Bis(cyclopentadienyl)magnesium gas ($Cp_2Mg$ gas), monomethylsilane gas ($SiH_3CH_3$ gas), monosilane gas ($SiH_4$ gas), dichlorosilane gas ($SiH_2Cl_2$ gas), trichlorosilane ($SiHCl_3$ gas), and a carrier gas (for example, hydrogen ($H_2$) gas)) is introduced from the gas supply inlets 11a and 11b into the reaction chamber 10.

A flow straightening plate 12 provided with a large number of holes is arranged below the gas supply inlets 11a and 11b so as to oppose the surface of a wafer w. The flow straightening plate 12 supplies the process gas supplied from the gas supply inlets 11a and 11b onto the surface of the wafer w with straighten process gas flow.

A susceptor 13 on which the introduced wafer w is placed is provided inside the reaction chamber 10. The outer circumferential portion of the susceptor 13 is fixed to the upper portion of the cylindrical rotating member 14. The susceptor 13 is manufactured using, for example, an SiC material because the inside of the reaction chamber 10 becomes very high in temperature. Although the disk-shaped susceptor 13 is used as an example of the wafer supporting member in the embodiment, an annular holder can also be used.

The rotating member 14 includes a rotating body 14a, a rotating base 14b, and a rotating shaft 14c. The rotating body 14a is an annular member that supports the outer circumferential portion of the susceptor 13 and is fixed to the upper portion of the outer circumferential portion of the rotating base 14b. The cylindrical rotating shaft 14c is fixed to the rotating base 14b. The axial center of the rotating shaft 14c runs through the center of the wafer w.

The rotating shaft 14c extends outside the reaction chamber 10 to be connected to a rotational drive controller 15. The rotational drive controller 15 rotates the rotating shaft 14c to rotate the susceptor 13 via the rotating base 14b and the rotating body 14a at, for example, 50 to 3000 rpm.

The abovementioned heater 16 for heating the wafer w from the backside is provided inside the rotating body 14a. The heater 16 is supported by bus bars 17a and 17b which are arm-shaped electrode parts. End portions of the bus bars 17a and 17b in the side opposite to the side supporting the heater electrode portions 16b and 16c are connected to electrodes 18a and 18b.

The bus bars 17a and 17b are electrode parts having both conductivity and high heat resistance and made of, for example, a C (carbon) material. The electrodes 18a and 18b are metal members made of, for example, Mo (molybdenite). The electrodes 18a and 18b are connected to the bus bars 17a and 17b at the upper end side and to an external power source (illustration is omitted) at the other end. A voltage of, for example, 115 V of 50 Hz is applied on the heater element 16a, via the electrodes 18a and 18b the bus bars 17a and 17b and the heater electrode portions 16b and 16c, from the external power source, and the heater element 16a generates heat.

As illustrated in FIG. 4, radiation thermometers 19a and 19b are provided in the upper portion of the reaction chamber 10 to measure the surface temperature (in-plane temperature) of the wafer w. In the embodiment, a portion of the top wall of the reaction chamber 10 and the flow straightening plate 12 are made of transparent quartz, so that the flow straightening plate 12 does not hinder temperature measurement by the radiation thermometers 19a and 19b. The radiation thermometers 19a and 19b respectively measure the surface temperature of the central portion and the surface temperature of the outer circumferential portion of the wafer w, which temperatures changing corresponding to the heat generated by the heater 16, and output temperature data to a temperature controller 20. The temperature controller 20 controls the output of the heater 16 based on the temperature data so as the surface temperature of the wafer w to be a predetermined film forming temperature (for example, 1100° C.)

As illustrated in FIG. 4, gas exhaust outlets 21a and 21b for exhausting the gas including residual process gas left after reaction and by-products resulting from reaction are provided in the lower portion of the reaction chamber 10. The gas exhaust outlets 21a and 21b are each connected to a gas exhauster 24 configured with an adjustment valve 22 and a vacuum pump 23. The gas exhauster 24 is controlled by the controller (illustration is omitted) to adjust the inside of the reaction chamber 10 to a predetermined pressure.

According to the embodiment as described above, by providing the turnover portion 162 of the heater element 16a, a current concentration during electrification can significantly be suppressed.

Moreover, although the tendency of a current flowing the shortest distance creates a region where no current flows and thus heat is not generated in the outer side of the turnover portion 162, the current flowing region can be broadened by arranging the end portion of the linear slit 163 with an inclination, and thereby current concentration can further be suppressed. As described above, the life of heater can be extended by suppressing current concentration, which reduces the replacement cycle of apart of a heater and thus enables reduction of cost and downtime of the semiconductor manufacturing apparatus.

Second Embodiment

Figure 5:
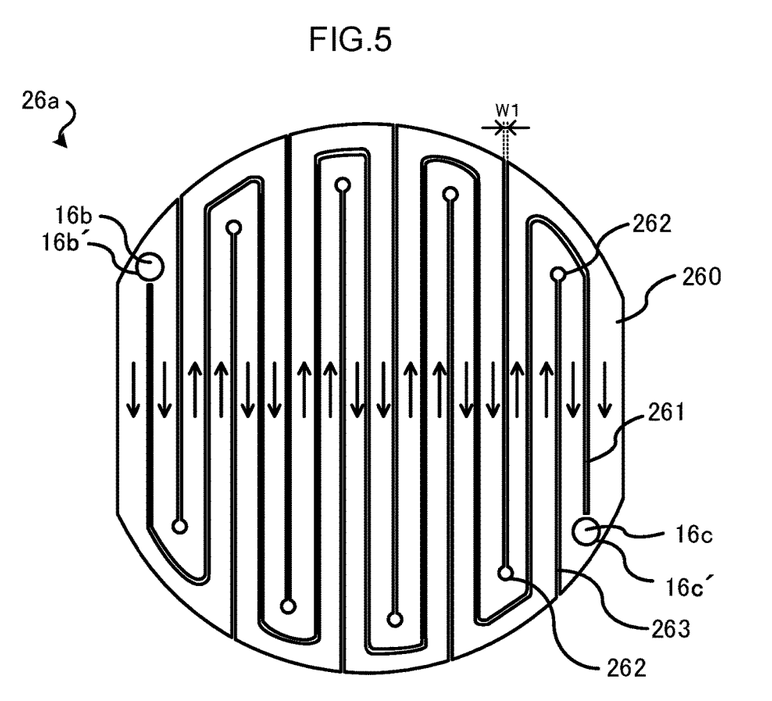
FIG. 5 is a top view of a heater element constituting a resistive heater according to a second embodiment.

A second embodiment of the present disclosure will now be described. The same reference sign as the reference sign appended in the first embodiment represents the same component. FIG. 5 is a top view of a heater element 26a constituting a resistive heater according to the embodiment. As illustrated in FIG. 5, the heater element 26a includes a disk-shaped heat generating body 260, a meandering slit 261 formed in the heat generating body 260, and eight, for example, linear slits 263 each having an end at the outer circumference of the heat generating body 260 and the other end on which a turnover portion 262 of the heat generating body 260 is formed. The width (diameter) of the turnover portion 262 is larger than the slit width of the meandering slit 261 and the linear slit 263.

The slits 261 and 263 are arranged in a manner such that distances between the heater electrode portions 16b and 16c and connecting portions 16b' and 16c' in which currents separately flow are the same.

In this heater configured as described above, when a voltage is applied across the connecting portion 16b' connected to the heater electrode portion 16b and the connecting portion 16c' connected to the heater electrode portion 16c, currents flows in two passages divided by the meandering slit 261 and the linear slits 263, as indicated by arrows in the figure, to generate heat as illustrated in FIG. 5.

Figure 6:
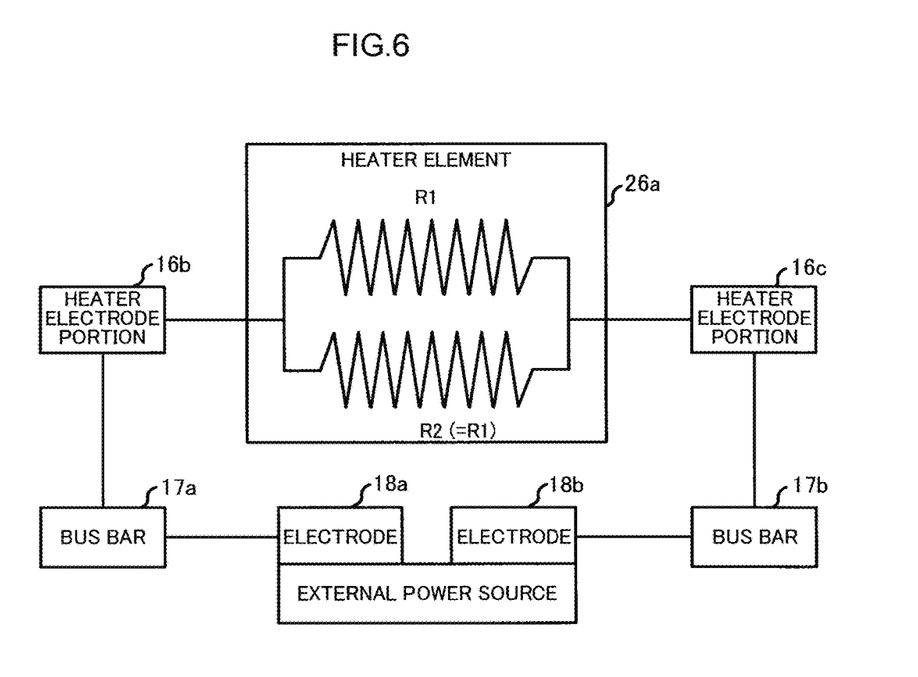
FIG. 6 is a figure illustrating an electrical connection of the heater element illustrated in FIG. 5.

FIG. 6 is a figure illustrating an electrical connection of the heater element 26a illustrated in FIG. 5. In the figure as will be described below, the heater element 26a, the heater electrode portions 16b and 16c, the bus bars 17a and 17b, and the electrodes 18a and 18b connected to an external power source constitute an electrical circuit. The heater element 26a, which is a resistive heat generating body, has a parallel structure inside and the heater element 26a is connected to the heater electrode portions 16b and 16c. As described above, since distances of the two passages in the heater element 16a in which currents separately flow are the same, two resistive components R1 and R2 are identical. Therefore, when the amount of a current flowing from the heater electrode portions 16b and 16c to the heater element 26a is I, the amount of current flowing in each of the two passages in the heater element 26a is I/2.

According to the embodiment as described above, by providing the meandering slit 261, currents separately flow in two passages in the heat generating body 260 of the heater element 26a, and thus the amount of the current flowing in the turnover portion 262 can be reduced than a conventional type. As a result, although the shape becomes more complex than the case of the first embodiment, the current concentration in the turnover portion 262 of the heater element 26a during electrification can significantly be suppressed, thereby extending the life of the heater. The replacement cycle of a part of the heater 26 can be reduced, and thus the cost and downtime of the semiconductor manufacturing apparatus can be reduced.

Although two current passages are provided in the heater element 26a of the embodiment, three or more passages that have an identical distance in which currents separately flow may be provided by providing suitably formed slits. The shape of the heater element 26a is not limited to a disk shape. An effect similar to the effect obtained by separating the current passages as in the embodiment can also be obtained without providing the turnover portion 262.

Third Embodiment

Figure 7:
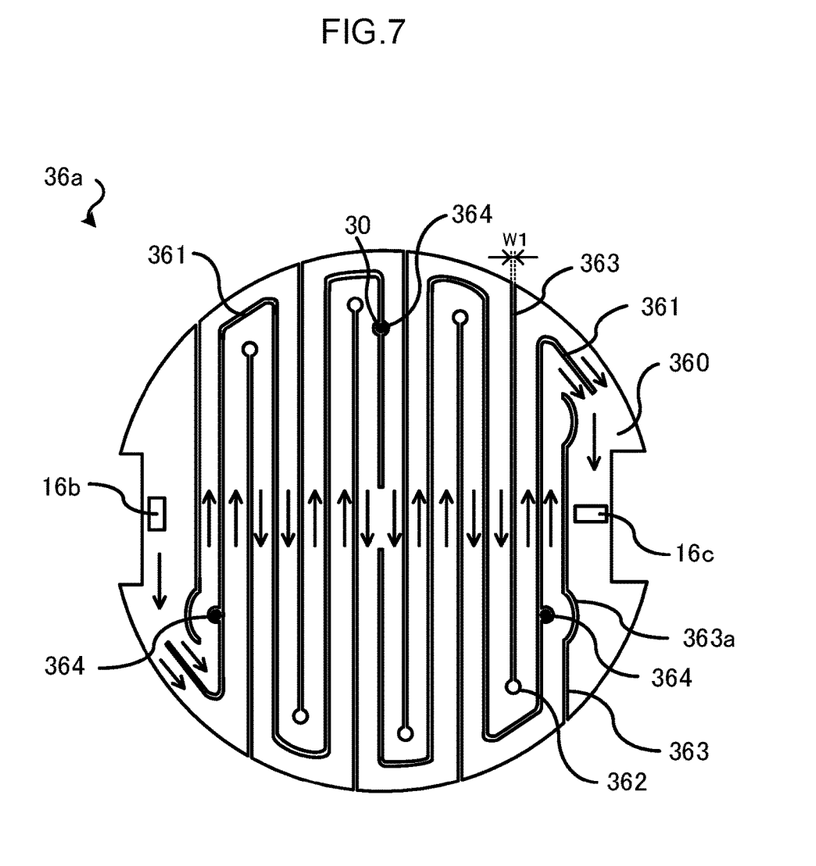
FIG. 7 is a top view of a heater element constituting a resistive heater according to a third embodiment.

FIG. 7 is a top view of a heater element 36a constituting a resistive heater according to the embodiment. The embodiment is different from the second embodiment in that a meandering slit 361 is not provided at the central portion of the heater element 36a where the potential at portions separated by a slit is approximately identical and at the vicinity of each of connections to the heater electrode portions 16b and 16c in the heat generating body 360.

Three pin holes 364 which serve as paths for protrusion pins 30 that receive a wafer w introduced into the reaction chamber 10 and place the wafer w on the susceptor 13 are formed in the heater element 36a in a manner connected to the meandering slit 361 to suppress reduction in heat generating area. Furthermore, a current arc portion 363a is formed on the linear slit 363 that is close to the pin hole 364 to avoid the conductive portion being narrowed by the pin hole 364. For a certain arrangement of the pin holes 364 for protrusion pins, the pin holes 364 may be connected to the linear slit 363. In such a case, the current arc portion 363a is arranged on the meandering slit 361.

According to the embodiment, the meandering slit 361 is separated by the equipotential central portion of the heater element 36a. Therefore, the total area of the meandering slit 361 can be kept small without affecting the current distribution and the strength of the heater 36 as a whole can be improved than the second embodiment illustrated in FIG. 6.

Figure 8:
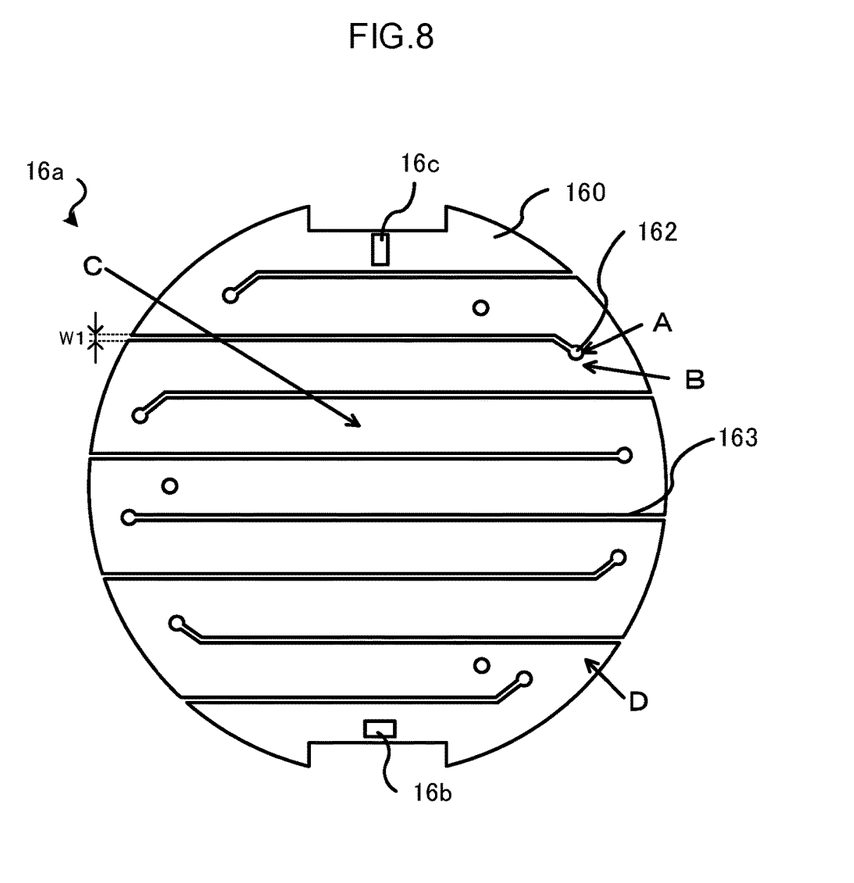
FIG. 8 is a figure explaining a heat generation distribution of the heater element according to the first embodiment.

FIG. 8 is a figure explaining a heater element 16a similar to the first embodiment. The heat generated at B in the outer circumference of the circumferential edge A of the turnover portion 162 is approximately 55% of the heat generated at A. The heat generated at C far from the turnover portion 162 is approximately 13% of the heat generated at A. The heat generated at D where current is hard to flow is approximately 6% of the heat generated at A. This shows that there is variation in in-plane heat generation.

Figure 9:
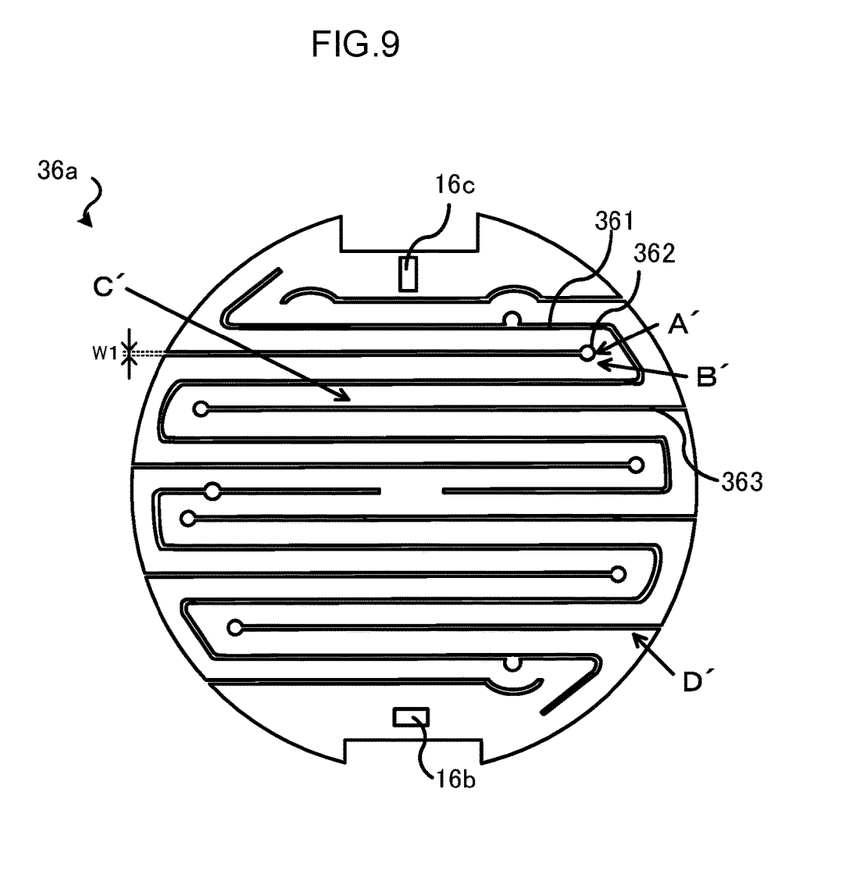
FIG. 9 is a figure explaining a heat generation distribution of the heater element illustrated in FIG. 7.

Meanwhile, in the heater element 36a according to the embodiment illustrated in FIG. 9, the heat generated at a circumferential edge A' of the turnover portion 362 is reduced to approximately 75% of the heat generated at A in FIG. 8. The heat generated at B' is approximately 60% and the heat generated at C' is approximately 30% of the heat generated at A'. The area of a portion where a current is hard to flow such as D' is reduced. As described above, current concentration can further be suppressed by providing the meandering slit 361, thereby improving the in-plane distribution.

Fourth Embodiment

Figure 10:
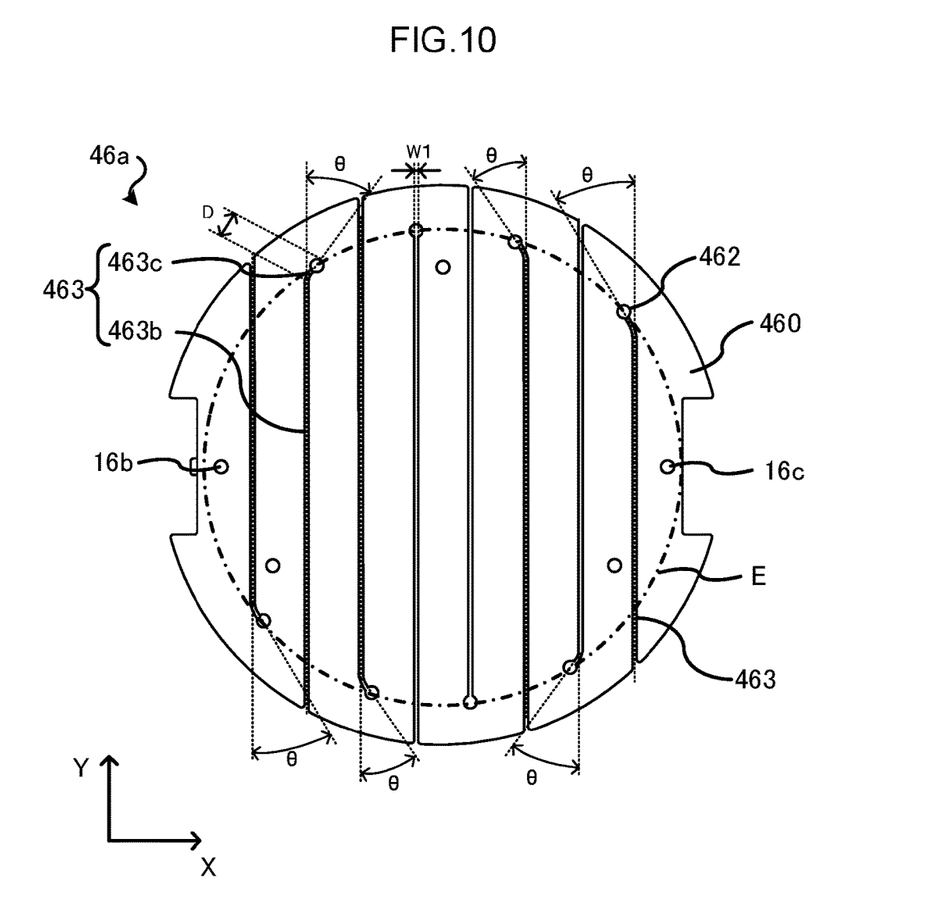
FIG. 10 is a top view of a heater element constituting a resistive heater according to a fourth embodiment.

FIG. 10 is a top view of a heater element 46a constituting a resistive heater according to the embodiment. As illustrated in FIG. 10, the heater element 46a according to the embodiment is different in that a linear slit 463 is chamfered at every end portion in the outer circumferential side of the heat generating body 460. Not only the slit end portion but also every corner portion of the heat generating body 460 may be chamfered. By chamfering the end portion where a current is hard to flow in the manner described above, breakage of the heater element 46a can be prevented without affecting temperature distribution. As in the embodiment, the end portion in the outer circumferential side of the linear slit of the heater element of the second and third embodiments may be chamfered.

While certain embodiments have been described these embodiments have been presented by way of example only, and are not intended to limit the scope of the inventions. Indeed, the novel embodiments described herein may be embodied in a variety of other forms: furthermore various omissions, substitutions and changes in the form of the embodiments described herein may be made without departing from the spirit of the inventions. The accompanying claims and there equivalents are intended to cover such forms or modifications as would fall within the scope and spirit of the invention.

What is claimed is:
1. A heater comprising:
 a substantially planar disc shaped heater element in which a slit having an end connected to an outer rim of the heater element on one side of the heater element and a slit having an end connected to the outer rim of the heater element on another side of the heater element are alternately formed; and
 a pair of electrodes provided on the heater element such that the plurality of slits interpose the pair of electrodes,
 wherein each of the plurality of slits comprises:
 a main portion having the end connected to the outer rim of the heater element, the main portions being mutually parallel, and an end portion having a first end connected to another end of the main portion and inclined with respect to the main portion to a direction along the outer rim of the heater element.

2. The heater according to claim 1, wherein a diameter of a second end of the end portion is larger than a width of the slits other than the second end.

3. The heater according to claim 1, wherein the heater element is provided with an aperture, a pin for raising and lowering a wafer being allowed to penetrate the aperture, the aperture continuing from one of the slits.

* * * * *